United States Patent [19]

Pelto et al.

[11] Patent Number: 5,364,418
[45] Date of Patent: Nov. 15, 1994

[54] PROCESS FOR COMPACTING SILVER NITRATE

[75] Inventors: Ralph H. Pelto, Rochester; Brian L. Simpson, Hamlin; Theodore E. Walker, Spencerport; John W. Crevelling, Rochester; Kevin M. Logsdon, Holley; Paul C. Drake, Brockport; Jeffrey R. Hennenkamp, Rochester, all of N.Y.

[73] Assignee: Eastman Kodak Company, Rochester, N.Y.

[21] Appl. No.: 135,115

[22] Filed: Oct. 12, 1993

Related U.S. Application Data

[63] Continuation-in-part of Ser. No. 848,446, Mar. 9, 1992, abandoned.

[51] Int. Cl.[5] .......................... C01G 5/00; C05B 19/00
[52] U.S. Cl. ........................ 23/313 R; 23/305 A; 423/395
[58] Field of Search ............ 423/395; 422/252; 23/305 R, 313 R

[56] References Cited

U.S. PATENT DOCUMENTS

| | | | |
|---|---|---|---|
| 2,414,680 | 1/1947 | West | 23/302 |
| 2,614,035 | 10/1952 | Robinson | 23/302 |
| 2,671,716 | 3/1954 | Ayres | 23/295 |
| 2,801,907 | 8/1957 | Scott | 23/295 |
| 3,306,710 | 2/1967 | Messing | 422/252 |
| 3,383,180 | 5/1968 | Kralik et al. | 23/301 |
| 3,530,924 | 9/1970 | Pomning | 422/252 |
| 3,556,733 | 1/1971 | Hedrick | 422/252 |
| 3,599,701 | 8/1971 | Mollerstedt et al. | 159/47 |
| 3,900,292 | 8/1975 | Fairchild | 23/273 |
| 3,970,431 | 7/1976 | Wise | 23/232 |
| 4,056,364 | 11/1977 | Dmitrovsky et al. | 23/273 |
| 5,000,928 | 3/1991 | White | 423/395 |

FOREIGN PATENT DOCUMENTS

| | | |
|---|---|---|
| 2267107A | 10/1990 | Japan . |
| 239225 | 5/1967 | U.S.S.R. . |
| 504705 | 12/1973 | U.S.S.R. . |

OTHER PUBLICATIONS

Browning, Agglomeration Growing Larger in Application and Technology, Chemical Engineering 4 Dec. 1967, pp. 147–169.
W. Pietsch "Roll Pressing", 2nd Edition 1987 Powder Advisory Centre pp. 1–19 pp. 98–101.
Bennett "Matching Crystallizer to Material" Chemical Engineering May 88 pp. 119–127.
Guccione, Silver Nitrate from New Plant, 99.9999% Pure Chemical Engineering Aug. 5, 1963 pp. 86–88.
McCabe, W. L. "Crystallization" Chemical Engineers Handbook 4th Edition Section 17 pp. 17-7–17-23.
Show et al Size Reduction and Size Enlargement Perry's Chemical Engineers Handbook 6th ed pp. 8–64.

*Primary Examiner*—Gary P. Straub
*Attorney, Agent, or Firm*—Carl F. Ruoff

[57] ABSTRACT

A process is disclosed for forming compacted silver nitrate bodies. A feed silver nitrate solution is introduced into an evaporative crystallizer (10). Steam is provided to a steam jacket (30) to heat the solution in the crystallizer (10) and form a slurry comprising silver nitrate crystals. The crystallizer (10) has an agitator (20) to mix the slurry and promote crystal growth. Slurry density is maintained within a desired range by controlling the rate of steam flow to the steam jacket (30) via a control valve (34). Slurry containing silver nitrate crystals is withdrawn from the crystallizer (10) and introduced to a centrifuge separator (78), for separating and drying the crystals. The separated, dried crystals are further dried by contact with an airstream and fall into a hopper (88). The crystals flow from the hopper into a translucent feed tube (96) and then into a roll compactor (100) that compacts the crystals to form the compacted silver nitrate bodies.

4 Claims, 9 Drawing Sheets

FIG. I

PROCESS FOR COMPACTING SILVER NITRATE

CROSS-REFERENCE TO RELATED APPLICATIONS

This is a continuation-in-part of co-pending application Ser. No. 07/848,446, filed on Mar. 9, 1992, now abandoned.

FIELD OF INVENTION

The present invention relates to a process for the manufacture of silver nitrate pellets. In particular, this invention relates to the preparation of silver nitrate crystals and the compaction of the crystals into a freely flowable form.

BACKGROUND OF THE INVENTION

Silver nitrate has many important industrial applications, for example, it is required for the manufacture of photographic materials, for certain catalytic uses, and for use in the pharmaceutical industry. In the process that is generally used for preparing silver nitrate, an aqueous silver nitrate solution is prepared and introduced to a cooling crystallizer. Cooling of the solution induces silver nitrate crystal growth. Solution containing silver nitrate crystals is then drawn from the crystallizer and the silver nitrate crystals are separated and dried.

Prior art processes suffer from serious deficiencies that have hindered their industrial utility. For example, a growth crystallizer such as a continuous cooling crystallizer typically has a residence time of about 12 to 24 hours, because low supersaturation is required to avoid fouling of the heat transfer surfaces. At shorter residence times and higher supersaturation, product begins to build up on cool metal surfaces, leading to fouling and blockage of the heat exchanger. A commercial size silver nitrate cooling crystallizer may therefore have to be shut down frequently, e.g. every 24 hours, for steam cleaning and defouling. Also, the process is time consuming because of the high residence time. This means that for a desired output of product, a large inventory of solution and therefore of silver must be maintained in the crystallizer. The size and the cost of the apparatus and facilities therefore is also high.

Silver nitrate crystals also have a tendency to fuse together especially if produced by evaporative crystallization, causing problems in its handling and its use. For example, fusing of a packaged crystal product creates a heavy, unwieldy block of material that can be hazardous to handle and prove difficult to redissolve for its intended use, such as in preparing photographic emulsions. The problem of fusing is accentuated as the mean particle size of the silver nitrate crystals decreases, thus exacerbating the problem for product produced by a process such as evaporative crystallization.

The present invention provides an industrially feasible and economically practical process that produces flowable silver nitrate while eliminating the requirement of a cooling crystallizer.

SUMMARY OF THE INVENTION

The present invention is a process for producing compacted silver nitrate. The process includes introducing a feed solution of an aqueous silver nitrate solution to an evaporative crystallizer, the silver nitrate solution having a concentration of 60 to 90 percent by weight. The silver nitrate solution is heated and concentrated in an evaporative crystallizer to form a supersaturated slurry comprising silver nitrate crystals wherein the temperature of the slurry is approximately 100°–149° F. and a vacuum level of 23 mm Hg to 200 mm Hg is maintained on the slurry. The residence time of the slurry is maintained at 60–180 minutes and the density of the slurry is maintained at 2.7 gm/cc to 3.2 gm/cc. Silver nitrate crystals having a size in the range of 200 μm to 600 μm and an aspect ratio of 1:2:3 to 1:1:1 are obtained and withdrawn from the crystallizer. The crystals are separated and dried using a centrifuge and then the crystals are compacted to form pellets.

Another aspect of the invention includes the pellets produced from the process.

DESCRIPTION OF THE PREFERRED EMBODIMENTS

The preparation of the aqueous silver nitrate solution used as a starting material in the invention is well known and is described, for example, in U. S. Pat. No. 5,000,928. The equation for the reaction of silver with nitric acid can be expressed as follows:

$$4Ag + 6HNO_3 \rightarrow 4AgNO_3 + NO + NO_2 + 3H_2O$$

After preparation, the silver nitrate solution can be purified prior to use as a starting material in the invention as is discussed further below. Purification of silver nitrate solutions is described, for example, in U.S. Pat. Nos. 1,039,325, 2,581,519, 5,000,928, and Jap. Kokai No. 521977-60294.

Figure 1:
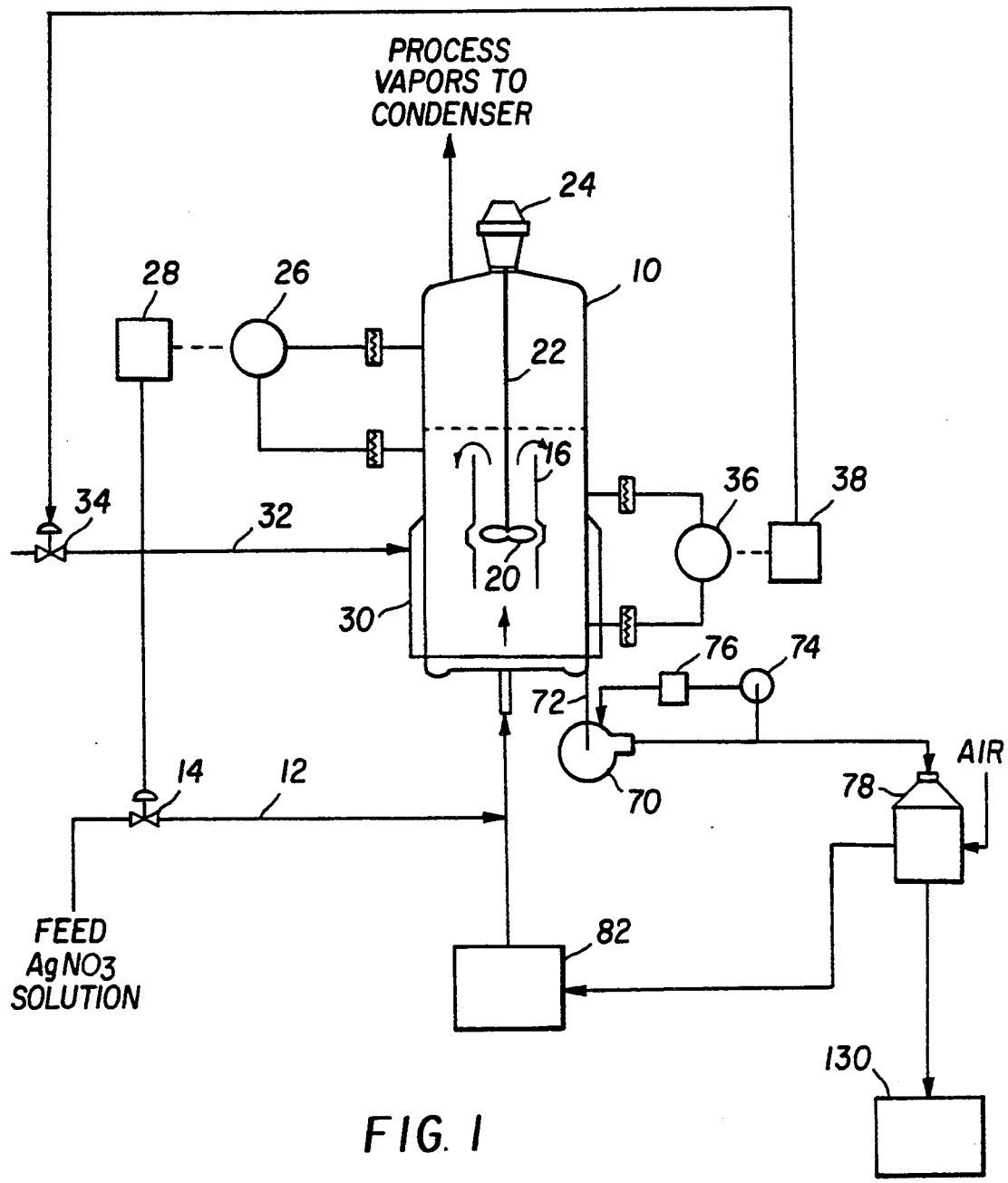
FIG. 1 is a schematic representation of apparatus of a continuous crystallization system according to the invention.

Referring now to FIG. 1, silver nitrate solution is introduced as the feed solution to evaporative crystallizer 10 via line 12 and flow control valve 14, the level of solution in crystallizer 10 being shown schematically as the dotted line. For efficient operation of the crystallizer, the concentration of silver nitrate in the silver nitrate feed solution should be in the range of from about 60 to about 90 percent by weight. The temperature of the feed solution entering the crystallizer should be in the range of from about 20° C. to about 85° C. The flow rate of feed solution to the crystallizer and/or the slurry discharge from the crystallizer can be established based on the desired production rate. Crystal growth is dependent on mean residence time in the crystallizer and other factors that are further discussed below.

The evaporative crystallizer employed in the invention should be a well-mixed evaporative crystallizer, such as is described below, in *Perry's Chemical Engineer's Handbook*, 6th Ed., Section 19, *Liquid-Solid Systems*, "Crystallization Equipment", Miller et al, pp. 19-35 to 19-40 (hereinafter "Perry's"), incorporated herein by reference, and in *Chemical Engineer's Handbook*, 4th Ed., Section 17, "Crystallization", Perry et al, pp. 17-7 to 17-23 (hereinafter "Crystallization"). In the preferred embodiment shown in FIG. 1, crystallizer 10 is a draft tube evaporative crystallizer comprising draft tube 16. Means for introducing the silver nitrate feed solution to crystallizer 10 can comprise any convenient system, e.g. a continuous silver nitrate feed solution production facility having an output pipeline serving as the input pipeline to crystallizer 10. Bladed agitator 20 is means for agitating the solution and the slurry along the flow path indicated by the direction arrows to promote the formation of a well-mixed slurry in a crystallization zone in and around draft tube 16. The solution level in the crystallizer should be maintained above draft tube 16 but by not more than about 2 inches (5 cm) to 6 inches (15 cm) to avoid leaving a poor slurry crystallization zone thereabove due to insufficient agitation and flow. At such a solution level, the crystallization zone effectively is the entire solution volume shown in crystallizer 10. Silver nitrate crystals typically form and grow while suspended in the crystallization zone. The well-mixed slurry promotes uniform silver nitrate crystal growth to achieve a desirable non-platelet crystal morphology as discussed below.

Agitator 20, for example a bladed agitator, is turned by shaft 22 which in turn is driven by motor 24. The silver nitrate slurry is dense, and agitator 20, shaft 22, and motor 24 should be sized accordingly, based on factors such as desired agitation rate and maximum expected loading. One skilled in the art can readily select the appropriately sized and powered agitator system for the particular crystallizer system design.

A crystallizer level controller system comprises level detector 26 that measures the level of solution in crystallizer 10 and provides a signal to level controller 28. Controller 28 provides an output signal to control valve 14, thereby automatically regulating the flow rate of feed solution to the crystallizer to maintain a desired level in the crystallizer.

Means for heating and concentrating the solution in the crystallizer is steam jacket 30 to which steam, e.g. low pressure steam at about 3 psig (122 kPa absolute) to 15 psig (205 kPa absolute), is supplied via line 32 and flow control valve 34. The heating evaporates water from the supersaturated solution, causing silver nitrate to crystallize and precipitate. Crystallizer 10 can also be heated by any other convenient heat transfer means such as are well known in the art. A preferred slurry temperature is in the range of from about 100° F. (38° C.) to about 149° F. (65° C.). At higher slurry temperatures, crystal growth can become too rapid and undesirable amounts of fines can form.

Preferably, a partial vacuum is provided and maintained in the vapor space in the crystallizer. The vacuum, for example, can be in the range of from about 23 mm Hg absolute to about 200 mm Hg absolute, with a preferred level of about 112 mm Hg absolute. The solution in the crystallizer is heated while vacuum is drawn. Means for maintaining a partial vacuum can comprise a cooling condenser having a vacuum source such as a vacuum pump to which the process gases, primarily water vapor, from the crystallizer vapor space can be exhausted. The heating under vacuum creates a concentrated, supersaturated slurry in which silver nitrate crystals are formed and grow. The vacuum level determines the temperature of crystallization.

Crystallization conditions such as slurry density and mean residence time are controlled in order to obtain a desired crystal habit and size. Crystal formation and its mechanisms are further described in "Crystallization" at pp. 17-11 to 17-15, incorporated herein by reference. Means for measuring the slurry density and for controlling the means for heating to maintain the slurry density within a desired range comprises differential pressure transmitter 36 and controller 38 that controls valve 34. Slurry density is measured by differential pressure transmitter 36 with diaphragm seals, which transmitter is a standard well-known device such as the Model 3051C manufactured by Rosemount, Inc. The concentration of solids in the slurry is related to slurry density by the equation Concentration of Solids = Slurry Density − Mother Liquor Density.

Slurry density is proportional to the pressure differential across differential pressure transmitter 36. Transmitter 36 provides a signal representative of solids content to controller 38. Controller 38 then provides a control signal to control valve 34 to adjust steam flow and thereby control the heating rate in the crystallizer. The slurry density is thus maintained at a desired level by controlling the heating of the slurry to thereby control evaporation from the slurry. In a preferred embodiment, slurry density is maintained in the range of from about 2.7 g/cc to about 3.2 g/cc, corresponding to about 18 to 45 weight percent silver nitrate, respectively. Alternatively, slurry density can be monitored manually and the crystallizer heating can be controlled manually, although automatic control as described is preferred.

The term "mean residence time" can be defined as the average time a unit of material, e.g. silver nitrate, remains in the crystallizer after introduction. The mean particle size and size distribution of crystals in the slurry is primarily determined by the mean residence time and the agitating regime in the crystallizer. For steady state conditions, mean residence time can be defined by the equation $$\text{Mean Residence Time} = \text{Vol}_s / v_{ws}$$

where $\text{Vol}_s$ is the volume of slurry in the crystallizer and $v_{ws}$ is the volumetric rate of withdrawing slurry from the crystallizer, with other parameters, e.g. slurry density and feed solution plus recycled solution flow to the crystallizer, being substantially constant. The smaller the mean particle size of the crystals, the more difficult it is to separate the crystals from the withdrawn portion of the slurry. Therefore, it is desirable to obtain crystals in the slurry having a mean particle size and size distribution capable of cost-effective separation, a factor which can influence the selection of minimum residence time. The upper limit on residence time is mainly determinable in regard to process efficiency, because crystal breakage tends to limit further process gains in crystal growth and size for long residence times in the apparatus of the invention. One skilled in the art can readily select the residence time for a particular system design and separator and for a desired product characteristic and output. For the preferred embodiment of the invention described herein for the stated operating parameters, e.g. feed concentration, feed temperature, and vacuum, a preferred residence time is in the range of from about 60 minutes to about 180 minutes.

Figure 2:
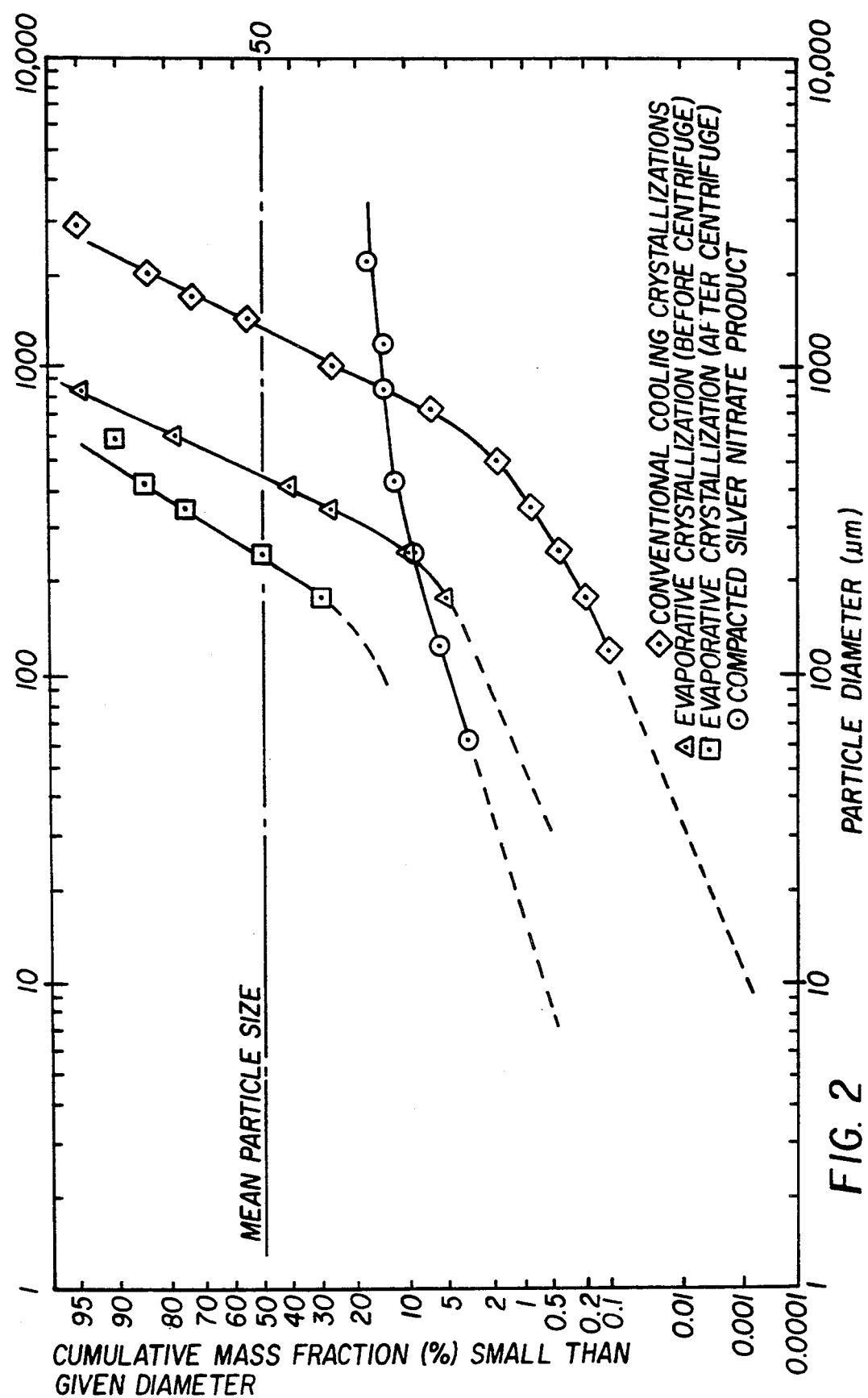
FIG. 2 is a graph showing the mean particle size and size distribution for the process of the invention and for a comparative process.

FIG. 2 shows the smaller mean particle size and size distribution of silver nitrate crystals formed by the process of the invention as compared to that formed by cooling crystallization. The size distribution and mean particle size of the crystals in the slurry are dependent on crystallization process conditions and on the crystallizer apparatus employed. Typically, the silver nitrate crystals of the invention have a size distribution in the range of from about 70 $\mu m$ up to about 1000 $\mu m$ and a mean particle size of from about 200 $\mu m$ to about 600 $\mu m$.

Figure 3A:
FIGS. 3a–3c are photomicrographs at magnifications of 10×, 20×, and 30× of silver nitrate crystals prepared by batch mode evaporative crystallization.
Figure 3B:
Figure 3C:
Figure 4A:
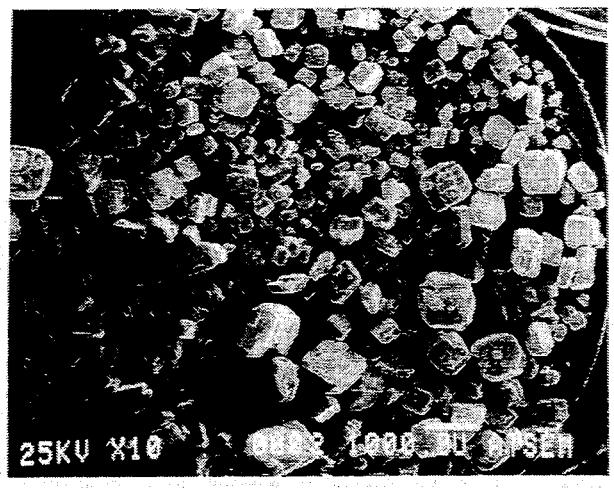
FIGS. 4a–4c are photomicrographs at magnifications of 10×, 20×, and 30× of silver nitrate crystals prepared by a pilot plant continuous evaporative crystallization process and apparatus.
Figure 4B:
Figure 4C:
Figure 5A:
FIGS. 5a–5c are photomicrographs at magnifications of 10×, 20×, and 30× of silver nitrate crystals prepared by a pilot plant continuous evaporative crystallization process and apparatus.
Figure 5B:
Figure 5C:

It has also been surprisingly found that, with the appropriate selection of residence time for a given set of process parameters, a form of silver nitrate crystal can be obtained that can be separated from the slurry and dried with less difficulty than with other known processes, as discussed further in the Examples. FIG. 3 shows silver nitrate crystals formed by a different process and apparatus. As shown in FIGS. 4 and 5, the process and apparatus of the invention produce silver nitrate crystals having more uniform growth along each axis than the silver nitrate crystals of FIG. 3. Prior art processes produce silver nitrate crystals having irregular crystal sizes and morphologies, and such crystals have a tendency to form agglomerates of platelet-like crystal structures. In comparison, the silver nitrate crystals of the invention have a more regular size and morphology and are more cubic than prior art crystals. The terms "more cubic" or "cubical" are meant to include orthorhombic crystals, that is, crystals having a polyhedron structure having x, y, and z axes, and each such pair of axes having about a 90 degree angle therebetween. Crystallization process parameters such as flow rates and residence time can be established to produce a slurry containing the cubic silver nitrate crystals of the invention. A preferred cubic silver nitrate crystal of the invention has an aspect ratio of between about 1:2:3 to 1:1:1, where aspect ratio is defined as the ratio of the x, y, and z orthorhombic crystal axes.

As discussed in the Examples below, the cubic silver nitrate of the invention is more easily deliquored, i.e. separated from the slurry, than irregular or platelet silver nitrate crystals, and therefore the process of the invention requires less time and can employ smaller, simpler apparatus to produce a given quantity of usable product than other processes. "Crystallization", pp. 17-7 to 17-8, incorporated herein by reference, further describes and defines the various crystallographic systems.

Means for withdrawing slurry comprising silver nitrate crystals from crystallizer 10, and for providing slurry to a separator for separation of crystals, is provided by variable speed pump 70 and line 72. Slurry flow rate is measured by flow monitor 74 that provides a representative signal to controller 76 for controlling the speed of pump 70 and thereby controlling the withdrawal of slurry from crystallizer 10 at a selected rate. At steady state conditions in the continuous process of the invention, the rate of feed and makeup solution to the crystallizer should be about equal to the rate of slurry withdrawal and exhaust of vapors to the condenser.

Crystallization of the silver nitrate and separation of the crystals as described herein produces silver nitrate product having a very substantial improvement in purity compared to the feed solution. Impurities are concentrated in the solution remaining in the crystallizer and in the liquor remaining from the separation step, producing a very pure silver nitrate crystalline product. The silver nitrate crystal product can typically exhibit an increase in purity in the range of about 30 to 100 times the purity of the feed solution as calculated by weight percent of the impurities present in the product and the feed solution. The pH of the crystal product is typically in the range of from about 3.5 to about 5.5, depending on the moisture and acid content in the product. Generally, pH increases as the moisture content decreases because the acid content in the product also decreases, and therefore the product also has a higher purity.

Figure 6:
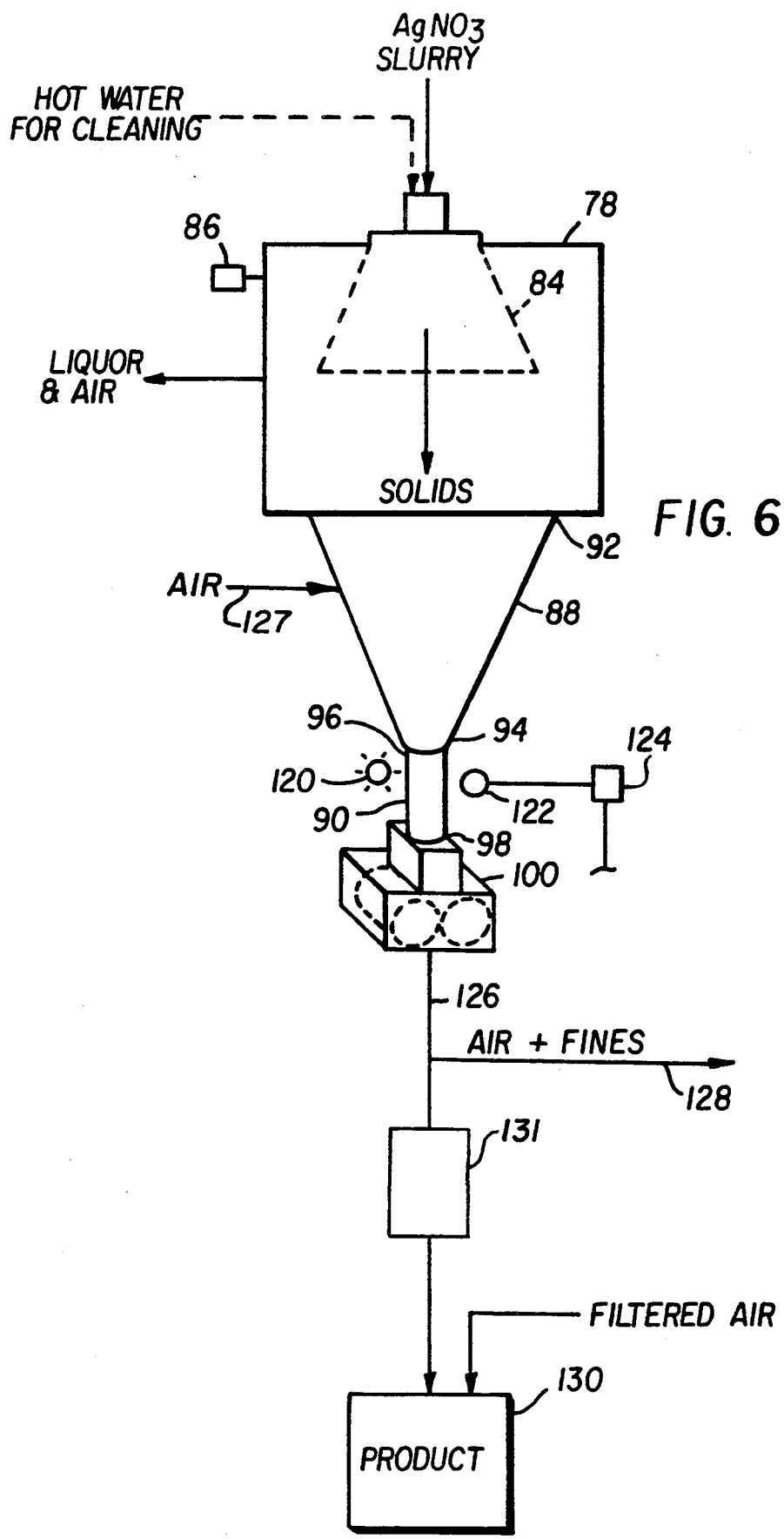
FIG. 6 is a schematic representation of separation and compaction apparatus according to the invention.

The slurry withdrawn from crystallizer 10 is introduced to a separator, centrifuge 78, to separate silver nitrate crystals from the slurry. Centrifuge 78 separates silver nitrate crystals from the slurry, leaving a residue liquor that is recycled to crystallizer 10 via dissolver 82. FIG. 6 further illustrates details of centrifuge 78. Centrifuge 78 is a rotary screen centrifuge, e.g. a Model GTLII manufactured by Heinkel Corp., with screen 84 shown in phantom. Other separators useful in the invention include continuous pusher centrifuges such as the Kraus-Maffei SZ30 and SB250 series units. The rotary screen centrifuge is a preferred separator, and particularly preferred is one having a high ratio of rated capacity to product throughput. The screen hole size can be readily selected depending on the size of the crystals desired to be separated from the slurry. In the well-known manner, the slurry is introduced to the intake of centrifuge 78 and is rotationally accelerated against screen 84, separating the slurry into a liquor and fines component which passes through screen 84 and a solids component comprising silver nitrate crystals which are stopped by screen 84 and discharged therefrom.

The next step in the process of the invention is drying the separated crystals. Control of moisture content is important in the preparation of silver nitrate. It is desirable to provide a consistent product for the eventual end-use, such as the preparation of photographic silver halide emulsions. At higher moisture levels, crystals can stick to surfaces, resulting in poor flowability from the separator and difficulty in handling. Some moisture content may be desirable, however, in order to prepare product having a desired pH value, and product pH can be dependent on moisture content as discussed in the Examples below. A preferred moisture content in the separated, uncompacted silver nitrate crystals is in the range of from about 0.001 percent to about 0.2 percent by weight, and 0.05 percent by weight is particularly preferred.

Surprisingly, it has been discovered that the invention provides a drier, more consistent product than do prior art processes and apparatus. Unlike the prior art, the invention does not require large, costly dryers. In the embodiment of the invention described herein, rotary screen centrifuge 78 is also a dryer, as it provides a drying function in addition to its above-described separating function. The inherent drying capability of centrifuge 78 can be supplemented by the introduction of an airstream to provide further drying of the crystals, as shown in FIG. 6. Line 127 is means for providing an airstream to the discharge end of centrifuge 78 to provide further drying of the crystals. The flow rate of air through line 127 to centrifuge 78 can be set so as to sufficiently dry the crystals a desired amount for a specified mass flow rate of separated, dried crystals. The moisture content of the separated crystal product depends on factors such as the speed of the centrifuge, the crystal habit, air addition rate, air temperature, slurry flow rate, slurry temperature, and the hole size of the centrifuge screen. One skilled in the art can readily select the operating parameters to obtain a desired product moisture level in the practice of the invention.

Extent of drying is determined by the ratio of the drying air flow rate to the crystal product flow rate. A preferred ratio of drying air flow rate at room temperature to the dried crystal flow rate is in the range of from about 0.75 CFH of air/lb/hr of crystals (0.047 $m^3$/hr of air/kg/min of crystals) to about 1.5 CFH of air/lb/hr of crystals (0.047 $m^3$/hr of air/kg/min of crystals), to obtain product moisture contents of from about 0.1 percent to about 0.001 percent by weight, respectively. Air temperature can be controlled within a range from room temperature to about 90° C.

Separation and drying can be carried out on a slurry at any convenient slurry temperature, and is particularly good at elevated slurry temperatures, e.g. in the range of from about 45° C. to about 65° C. At lower slurry temperatures, the moisture content in the crystal product can increase. At higher slurry temperatures, the slurry can be more difficult to handle because the pipelines have an increased tendency to plug up. The appropriate separator can be selected based on factors such as slurry and crystal characteristics and the like. For example, the rotary screen hole size can be selected based on the mean particle size and size distribution of the crystals in the slurry to be being separated. In a preferred embodiment, the aqueous slurry comprises silver nitrate crystals having a mean particle size in the range of from about 200 mm to about 600 mm, and the screen has holes sized to separate and dry crystals having a size of about 50 mm and up.

Silver nitrate crystals can accumulate over time on screen 84, which can adversely affect the rotational stability of centrifuge 78 and cause unacceptable vibration levels. Accordingly, means for cleaning screen 84 is provided, comprising a controlled, intermittent introduction of hot water to centrifuge 78. The hot water should have a sufficient flow rate for a sufficient time to substantially flush and clean screen 84. For example, a flow rate of about 5 gallons per minute (19 L/min), for a time of about 10 seconds, at a water temperature of about 50° C. can provide adequate cleaning without substantial interruption of the continuous separation and drying of the silver nitrate crystals. During continuous operations, a preferred time interval between cleanings is about 1.5 hours. A standard vibration sensor 86 is mounted on centrifuge 78 to monitor the vibration level.

The invention also includes a novel way of treating the silver nitrate crystal product to facilitate subsequent use and handling of the product. As discussed above, the silver nitrate crystals produced in the process of the invention have a substantially cubic morphology compared to the complex aggregate or platelet-type structure of crystals produced by other processes. The crystal product can also have a mean particle size and size distribution smaller than that produced by prior art processes. As described above, these characteristics lend some advantages to the crystal product of the invention. An accompanying disadvantage, however, is that the smaller crystals may have a greater tendency to fuse, creating large chunks of material that are difficult to handle and use.

Figure 7:
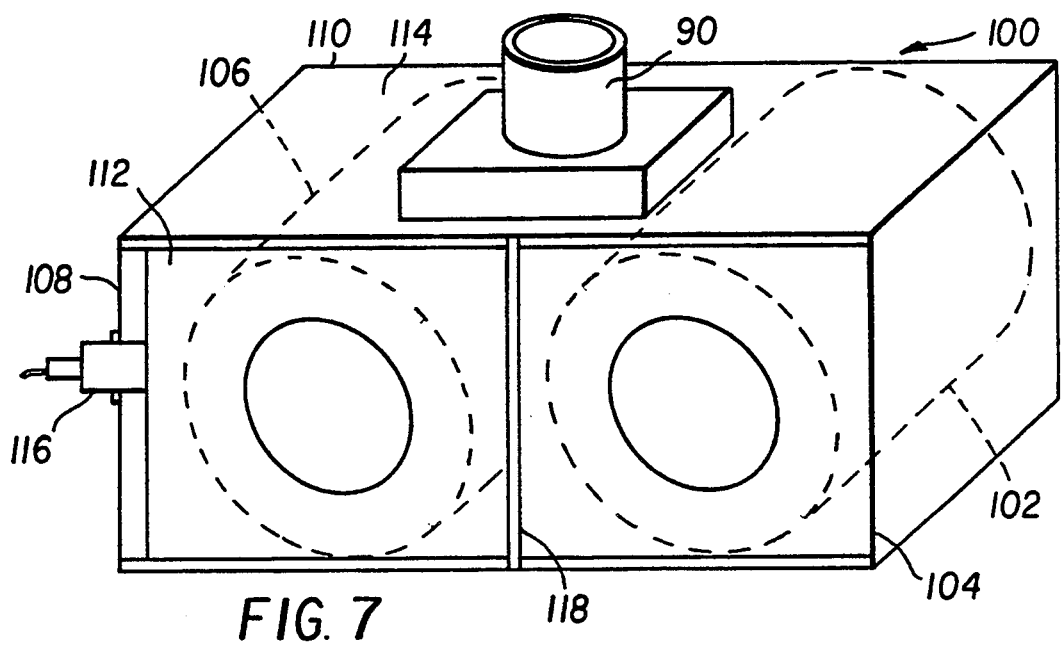
FIG. 7 is a front elevation schematic view of a roll compactor.

Accordingly, in another aspect of the invention, after separation and drying, the silver nitrate crystal product is compacted to form a plurality of small, flowable, compacted silver nitrate bodies. Each compacted silver nitrate body has a compacted surface and density sufficient to allow the body to freely disengage from surface contact with other similar bodies so that the body is freely flowable despite the contact with the other such bodies. Referring now to FIGS. 6 and 7, in order to form the compacts, the separated, dried crystals drop from screen 84 into solids discharge chamber 88. Chamber 88 should be polished, and have a discharge diameter of about 4 inches (102 mm) or larger and a cone angle of about 40 degrees to substantially prevent or minimize bridging and clogging of the crystals therein. The crystals discharge from chamber 88 into feed tube 90. Feed tube 90 is seamless and without surface projections to avoid bridging of the crystals and blockage of crystal flow in feed tube 90. Chamber 88 has first end 92 engaged with the discharge end of centrifuge 78 and second end 94 engaged with first end 96 of feed tube 90. Second end 98 of feed tube 90 is engaged with compactor 100.

The invention encompasses any well-known compactor, such as a tablet press, pellet press, rotary pan sphereinizer, or a roll compactor. The rotary pan sphereinizer produces compacts having a high moisture content and therefore increased drying of the product is necessary. The pellet press uses lubricating materials that may contaminate the product and can be inconvenient or impractical for a continuous process producing a large quantity of a highly purified product. A roll compactor is preferred, since it does not have the aforementioned problems, it is capable of providing a continuous, large throughput of uncontaminated product, and is economical to use. Roll compactors are described in *Roll Pressing*, W. Pietsch, Powder Advisory Centre, P.O. Box 78, London NW11 OPG, England (2nd Ed. 1987) (hereinafter "Pietsch"), incorporated herein by reference. Roll compactors comprise one of two typical designs, cantilevered and mill shaft. The mill shaft design can accommodate higher compaction pressures and roll forces and have a higher capacity than a comparably sized cantilevered roll compactor, and is preferred for compacting the dense silver nitrate crystals of the invention. A representative roll compactor useful in the invention is the Model 4B4LX10 Chilsonator, manufactured by The Fitzpatrick Company.

Compactor 100, as shown in FIGS. 6 and 7, is a roll compactor. Compactor 100 comprises fixed, drive roll 102 rotatably mounted within housing 104, and movable, idler roll 106 rotatably mounted within housing 104 and slidably mounted on opposing walls 108 and 110 of housing 104 by bearing blocks 112 and 114, respectively. Rolls 102 and 106 are mounted such that their axes of rotation are substantially parallel during compaction. Movable roll 106 is an idler roll that is gear-driven by a standard gear mechanism (not illustrated) driven by roll 102. Roll 102 is associated with standard drive means (not illustrated). The actuator of hydraulic piston 116 is connected to plate 112 to provide a force to movable roll 106 during compacting. Machined spacer plate 118 establishes a minimum gap between the edges of rolls 102 and 106 in order to ensure and maintain a desired minimum flow of material through the nip and past the rolls while permitting a sufficient flow rate of material therethrough to minimize webbing between individual compacts. It is important to minimize webbing to minimize the amount of fines in the compacted product. Because roll 106 is slidably mounted on housing 104, the roll gap can be adjusted and roll 106 has some freedom of movement during compaction. The roll gap thus affects the percentage of fines in the compacted product. The roll gap should be small when using a roller design having a pocketed surface to limit webbing around the compact to an acceptable amount. Increased webbing can lead to increased fines, which can cause additional exposure to workers handling the compacted silver nitrate product. A minimum spacer setting and minimum roll gap is about 0.002 inches (0.05 mm). The preferred operating roll gap is approximately 0.007 inches although roll gaps as large as 0.080 inches have been successfully implemented with few fines in the final product.

The size and density of a compact of silver nitrate depends on factors such as the type of compactor used and the compacting force employed. The density of uncompacted silver nitrate crystals can typically be about 2.25 g/cc to about 2.30 g/cc. The density of a coherent, hard compact of silver nitrate is generally in the range of from about 3.5 g/cc to about the theoretical density of silver nitrate, which is 4.35 g/cc.

Surprisingly, it has been found that the process and apparatus of the invention provide a coherent, hard compact that can be prepared from uncompacted silver nitrate crystals that are either wet or dry, and without necessitating the addition to the uncompacted powder of a binder, e.g. polyvinyl alcohol. The fact that a binder is unnecessary is a significant aspect of the invention, because a binder can contaminate the silver nitrate and make it impracticable to use in applications requiring high-purity silver nitrate. Examples requiring the use of highly-pure silver nitrate include catalysis, and the preparation of photographic emulsions.

Figure 8A:
FIGS. 8a–8c are enlarged, schematic representation of a compacts of the invention.
Figure 8B:
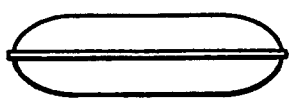
Figure 8C:
Figure 9:
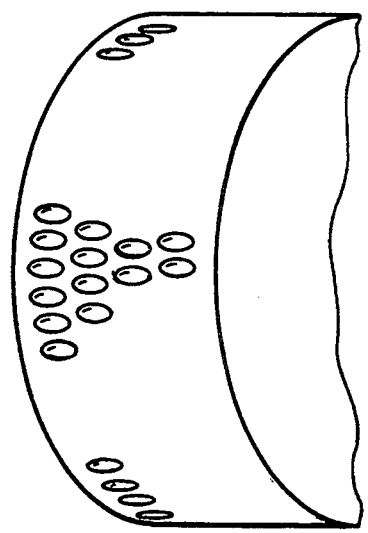
FIG. 9 is a front elevation view showing detail of the compactor roller surface.

FIGS. 8 (A-C) illustrate a compacted body, or "compact", of silver nitrate such as is formed by compactor 100. The size of the compact is a function of the roll surface cavity design as illustrated in FIG. 9. The density of a compact is a function of the roll force, which is proportional to the compaction pressure. Compaction pressures in the range of from about 500 psi (3450 kPa) to about 80,000 psi (552,000 kPa) form a usable silver nitrate compact of the invention, although the integrity of the compact is better at a higher compaction pressure and less fines may be generated. Material fed into the roll gap is subject to a compaction force proportionate to the roll force, although a precise compaction pressure is difficult to measure. In the described embodiment, using a roll compactor having about a 4 inch (102 mm) wide compacting zone between two 10 inch (25.4 cm) diameter rolls, a preferred roll force is in the range of from about 16,000 pounds (7,270 kg) to about 40,000 pounds (18,200 kg) to produce good compaction pressures.

The separated, dried silver nitrate crystals are typically fairly dense. As the roll force is increased there is a point at which the crystals approach maximum compaction. "Compaction ratio" is the ratio of the density of the silver nitrate compact to the density of the uncompacted silver nitrate crystals. Typically, the compaction ratio for silver nitrate has a maximum value of about 2 and is approached in the described embodiment at a roll force of about 32,000 pounds (14,545 kg). The density of a compact of silver nitrate is typically in the range of from about 3.5 g/cc to about 4.35 g/cc for a roll force of from about 16,000 pounds (7,270 kg) to about 40,000 pounds (18,200 kg), respectively.

Roll speed can be selected so as to optimize product throughput while maintaining compact coherency. The maximum speed should therefore not exceed that at which a starved feed condition occurs. A minimum speed should be established such that a sufficient throughput is achieved and such that product bridging can be substantially avoided. "Bridging" is the fusing together of crystals. One skilled in the art can readily select and maintain appropriate minimum and maximum operating roll speeds, and the roll speed can also be controlled automatically as is further described herein.

It is desirable to maintain a substantially continuous feed of crystals to compactor 100 in carrying out the continuous process of the invention, but if the level of silver nitrate crystals is above feed tube 90, bridging of the crystals can occur between centrifuge 78 and compactor 100, slowing the flow of crystals. Accordingly, there is provided an optical level monitor comprising light source 120 and detector 122 which are each positioned such that feed tube 90 is positioned therebetween. Feed tube 90 is fabricated of clear Teflon or other translucent material to allow detector 122 to monitor the level of crystals in feed tube 90. Detector 122 provides an output signal to controller 124, and controller 124 computes a correction value and provides a control signal to adjust the speed of compactor 100, thereby maintaining the desired level of crystals in feed tube 90. One skilled in the art can determine the relative positions of light source 120, feed tube 90, and detector 122 and the appropriate instrument and control settings. For example, light source 120 should be positioned sufficiently close to feed tube 90 for detector 122 to accurately monitor light transmitted through feed tube 90 during operation, e.g. as dust collects on the inner surfaces of feed tube 90.

Although compacting the silver nitrate crystals helps to minimize the amount of fines present in the product, fines are not reduced to zero. Fines can be further removed from the compacted product prior to storing the product by contacting the compacted product with a motive airstream to sweep fines from the product. In a preferred embodiment further described below, the airstream containing fines is also employed to dry separated silver nitrate crystals in the centrifuge and fines are recovered for compacting.

The feeding of crystals to the compactor in the continuous process of the invention should achieve a uniform and continuous crystal feed. Feeding can be either gravity feeding or force feeding, both of which are well known in the art. In the embodiment of the invention using a centrifuge separator/dryer, with the compactor positioned under the centrifuge as shown in FIG. 7, gravity feed of crystals should generally suffice and there is no need to force feed the compactor.

Compacted bodies of silver nitrate are discharged from compactor 100 to line 126. Means for passing air through the compacted bodies to remove fines comprises filtered air by which air is introduced to contact and pass through the compacts. Line 128 is means for recycling air containing fines to various stages of the process. It is preferable to recycle the fines to the dissolver 82, however, the fines can also be recycled to chamber 88. The compacted product can be discharged directly into storage container 130, which can be maintained at a negative pressure. To prevent contamination of the stored silver nitrate product by providing a filtered air supply is provided as shown to storage container 130. It has been found desirable to cool the compacted silver nitrate in a chill box 131 prior to loading the compacts into the storage container. The compacts are approximately the temperature of the evaporative crystallizer and cooling prevents condensation in the storage container. Other methods of cooling are possible. FIG. 8 illustrates a typical compact prepared by the invention. The compact is preferably spherically or elliptically shaped as shown, presenting fewer contact points for crystals to fuse and allowing the compacts to separate easily such as when poured from a storage container.

The process for preparing the compacted silver nitrate crystal product is continuous. Accordingly, it is important to substantially match product flow rates in the subsystems that comprise the overall system and apparatus, e.g. the crystallizer, the separator, and the compactor. One skilled in the art can readily select the appropriate such flow rates and can select the specific component sizes to achieve the desired system stability. Means for adjusting subsystem product flows to compensate for such changes or transients in flow rates can be provided. For example, the speed of the compactor is adjusted as described above to maintain a desired level of crystal feed to the compactor. Similarly, slurry withdrawal rate can be adjusted by varying the speed of pump 70 to adjust slurry flow to the separator.

It is preferred that the process of the invention is carried out at a system pressure below ambient air pressure in order to minimize leakage of material from the system to the environment to limit exposure to workers and others.

The invention is further illustrated by the following Examples.

EXAMPLE 1

Silver nitrate crystals were prepared by evaporative crystallization and by cooling crystallization to compare crystal growth rates and estimate comparative residence times. Tests were run with both types of crystallizers on a feed silver nitrate solution containing impurities, and also with the evaporative crystallizer on a feed silver nitrate solution substantially without impurities. Each test was conducted using a 4 liter crystallizer as follows:

Vacuum cooling crystallizer

A feed solution of silver nitrate containing impurities was introduced to a cooling crystallizer. The residence time in the crystallizer was 1.5 hours, and the crystal growth rate was calculated to be 0.2444 m/hr.

Evaporative crystallizer

A feed solution of silver nitrate, which in a first run contained impurities and in a second run was substantially free of impurities, was introduced to an evaporative crystallizer. The residence time in the first run was 1.5 hours, and the crystal growth rate was calculated to be 0.3474 m/hr. The residence time in the second run was 30 minutes, and the crystal growth rate was calculated to be 1.2360 mm/hr. The results demonstrate that the evaporative crystallizer provides improved silver nitrate crystal growth rate, especially for a silver nitrate feed solution containing a low level of impurities.

EXAMPLE 2

A feed solution comprising 79 percent by weight of silver nitrate and about 0.02 percent by weight of impurities was introduced to a 3 liter, jacketed, draft tube, evaporative crystallizer having an A310 impeller agitator that was run at a speed of 800 rpm. The solution was heated to 50° C. The solution was then cooled at a rate of 25° C. for 2 hours (which is therefore the 'mean residence time' for the test) to form a slurry comprising silver nitrate crystals. The slurry was then removed and immediately filtered to collect the silver nitrate crystals. FIG. 3 is a photomicrograph of the silver nitrate crystals. The crystals exhibited a platelet-type of crystal habit not readily dewaterable by separation techniques such as centrifugation.

EXAMPLE 3

Tests were conducted using the apparatus as illustrated in FIG. 1, which was scaled up from the crystallizer apparatus used in Example 1. A silver nitrate feed solution with a density of 2.7 g $AgNO_3$/cc solution and a temperature of 74° C. was introduced to a 125 gallon (473 liter), draft tube, agitated, evaporative crystallizer at a flow rate of 4 gallons per minute. The solution was agitated, and vacuum was maintained in the crystallizer of from between 61 mm Hg absolute and 112 mm Hg absolute, corresponding to solution temperatures of between 45° C. and 65° C. The residence time varied from about 1.5 to 3.5 hours.

FIGS. 4 and 5 are electron micrographs of the crystals formed at a 1.5 hour residence time. Surprisingly, the silver nitrate crystals formed in the scaled-up apparatus exhibit more even growth along the crystal axes, that is, they are regularly shaped cubical crystals and less platelet in shape than the silver nitrate crystals formed in the 3 liter evaporative crystallizer in Example 2 at the same residence time of 1.5 hours. The cubical crystals have a mean particle size in the range of from about 200 to about 600 microns, depending on process parameters such as residence time and crystallizer slurry homogeneity.

The cubical crystals of FIGS. 4 and 5 were found to filter out, and therefore are deliquored, more easily than the platelet-like crystals of FIG. 3. Representative distributions of particle size are shown in FIG. 2 in which the mean particle size is indicated for each curve.

EXAMPLE 4

Figure 10:
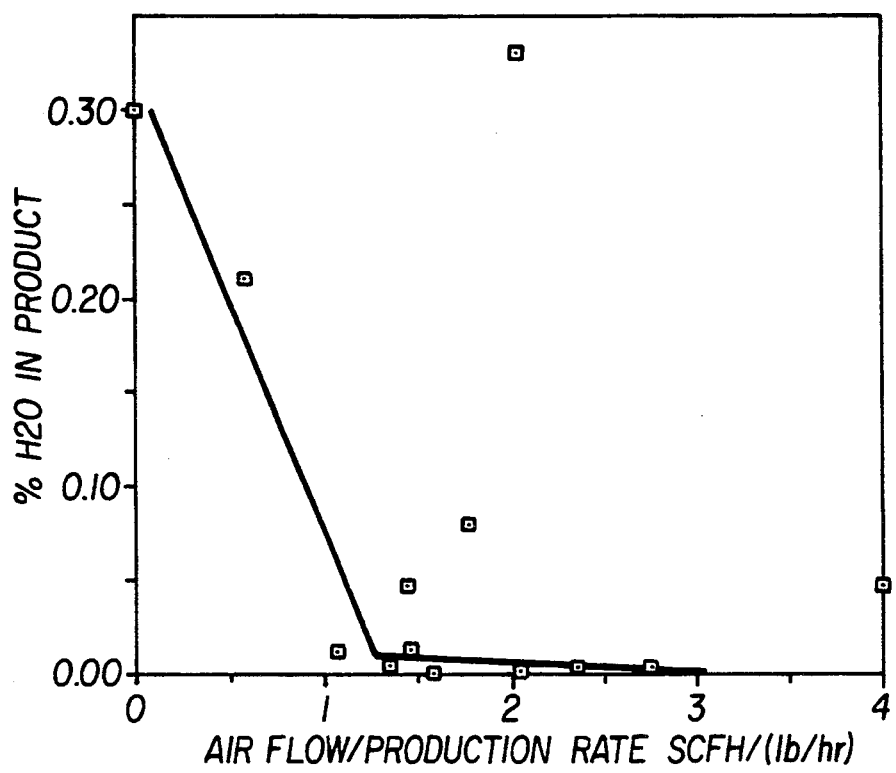
FIG. 10 is a graph of moisture content in the product versus the ratio of drying air flow rate to product flow rate.

Silver nitrate crystals prepared in the apparatus and process of the invention, as illustrated by FIGS. 1 and 6, were dried in a rotary screen centrifuge, both without air supplied to the centrifuge, and with drying air supplied to the centrifuge at various flow rates. The results are shown in Table 1 below and in FIGS. 10–12. "N/A" means that data was not taken or was not available.

TABLE 1

| Run | Air Flow Rate in CFH (m³/hr) | Moisture Content (Wgt %) | Slurry Pump Speed % | Slurry Density (g/cc) | Dried Silver Nitrate Product Rate in lb/hr (kg/hr) | Air Flow/Product Rate in CFH of air/lb/hr of crystals (m³/hr of air/kg/min of crystals) |
|---|---|---|---|---|---|---|
| 1  | 0 (0)       | 0.3000 | 8.9  | 3.06  | N/A       | N/A        |
| 2  | 300 (8.5)   | 0.0130 | 7.0  | N/A   | 281 (128) | 1.0 (0.06) |
| 3  | 500 (14)    | 0.0800 | 7.0  | N/A   | 281 (128) | 1.7 (0.10) |
| 4  | 500 (14)    | 0.0140 | 8.5  | N/A   | 342 (155) | 1.7 (0.09) |
| 5  | 540 (15.3)  | 0.0470 | 10.5 | 2.960 | 135 (61)  | N/A        |
| 6  | 500 (14)    | 0.0045 | 9.0  | 3.000 | 182 (83)  | 2.7 (0.16) |
| 7  | 500 (14)    | 0.0035 | 9.2  | 2.990 | 212 (96)  | 2.3 (0.14) |
| 8  | 500 (14)    | 0.0016 | 12.4 | 3.400 | 316 (144) | 1.5 (0.09) |
| 9  | 387 (11)    | 0.0035 | 10.0 | 3.070 | 285 (130) | 1.3 (0.08) |
| 10 | 583 (16.5)  | 0.3300 | 8.1  | 3.030 | 285 (130) | 2.0 (0.12) |
| 11 | 583 (16.5)  | 0.0011 | 8.5  | 3.040 | 285 (130) | 2.0 (0.12) |
| 12 | 387 (11)    | 0.2100 | 22.7 | 2.970 | 667 (303) | 2.0 (0.03) |
| 13 | 420 (11.9)  | 0.05   | 23.1 | 2.870 | 292 (133) | 1.44 (0.08)|

Figure 11:
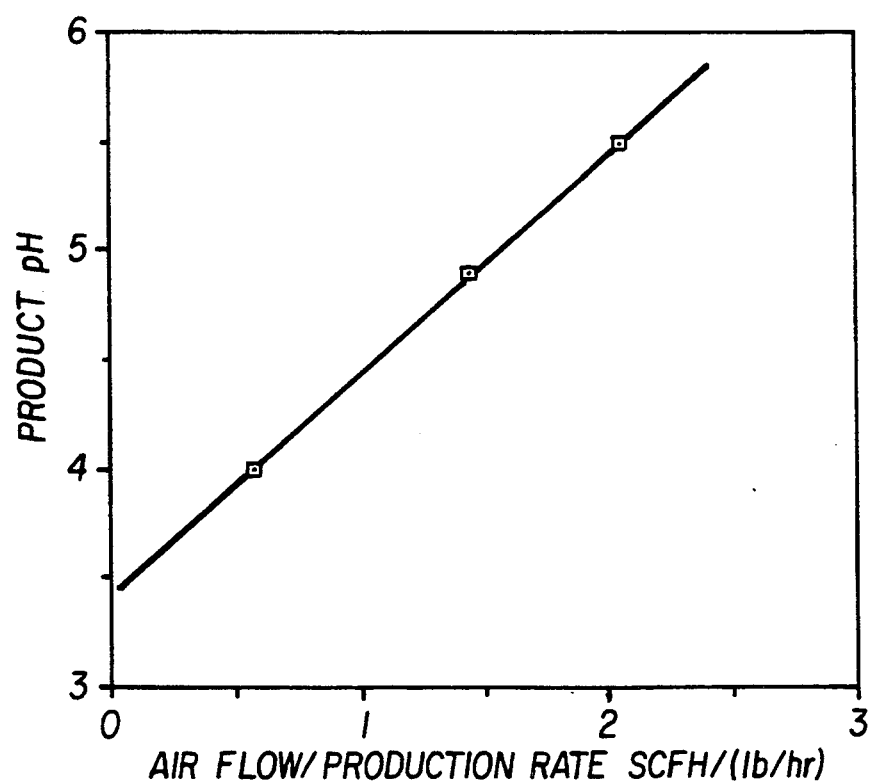
FIG. 11 is a graph of product pH versus drying air flow rate.
Figure 12:
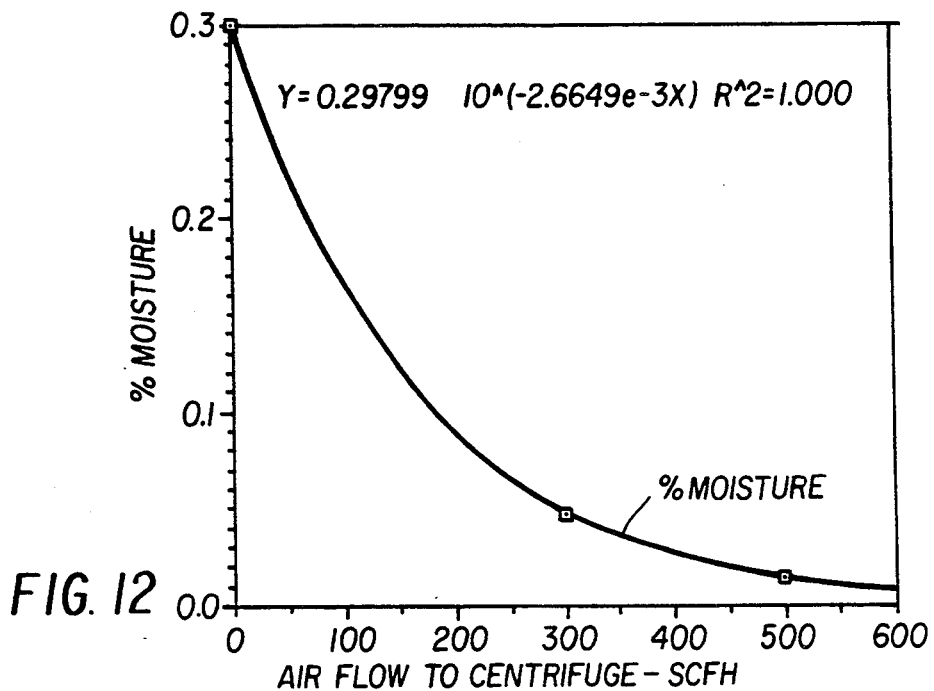
FIG. 12 is a graph of product moisture content versus drying air flow rate.

The product pH in runs 11, 12, and 13 was 5.5, 4.0, and 4.9, respectively, and the results are shown in FIG. 11.

As can be seen from Table 1 and the Figures, good percentage decreases in product moisture are exhibited until the drying air flow rate is about 1 CFH/(lb/hr) (see FIG. 10), at which point increases in flow rate do not provide a high percentage of drying of the product. FIG. 11 shows that the product pH increases as air flow rate is increased. Thus, as the moisture content in the product decreases, the pH increases, due to removal of residual acidic liquors in the crystal product during the air-drying process. Variations in the results occurred and can be explained as follows:

Run 3—the product exhibited a higher than expected moisture content, which was probably attributable to residual water blown into the product from the air lines upon start-up of the drying air.

Run 5—moisture content in the product was higher than expected, probably due to the relatively low slurry density.

Run 10—the moisture content in the product was higher than expected, probably attributable to residual water blown into the product from the air lines upon start-up of the drying air.

EXAMPLE 5

Compaction tests were carried out to determine the feasibility of compacting silver nitrate to form coherent, flowable compacted bodies. The compactor was a hydraulic press employing a cylindrical ram die with an inside diameter of 1.127 inches (28.6 mm) and a cross-sectional area of 0.9975 square inches (6.43 cm²).

Figure 13:
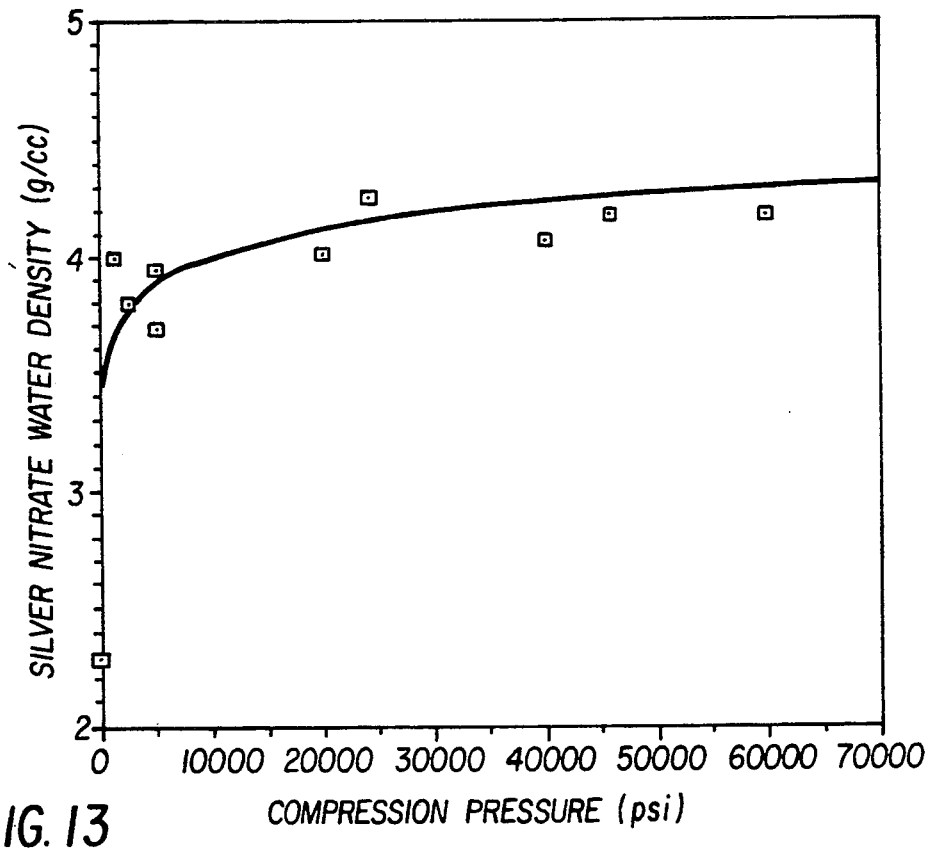
FIG. 13 is a graph of compact density versus compaction pressure for compacted silver nitrate of the invention.

Each test was conducted with a die loading of about 10 grams of silver nitrate powder. The uncompacted powder density was about 2.28 g/cc and had a moisture content of between 0.15 and 0.25 weight percent. The ram was inserted and spun gently to level out the surface of the powder. Measurements of the die length prior to compression were used to determine the uncompressed bulk density of the powder. The die was placed in the press and placed under the selected load for about 10 seconds. The resulting wafer was ejected from the bottom of the die and weighed and measured to determine the resulting wafer density. The results are shown in FIG. 13 as a graph of wafer density versus compression pressure.

Compression pressures as low as 1000 psi (6900 kPa) formed coherent wafers that were hard and brittle. At compression pressures of 20,000 psi (138,000 kPa) and greater, the wafers did not readily eject from the die. At pressures of 40,000 psi (276,000 kPa) and greater, a blow with a mallet was required to eject the wafers. At such pressures, the wafers formed were harder than those formed at pressures under 20,000 psi (138,000 kPa). At high compression forces, the density of the wafers approached the theoretical silver nitrate density of about 4.35 g/cc.

Two samples of wet silver nitrate crystals prepared in a pusher centrifuge were also compaction-tested. Compression pressures of 5,000 psi (34,500 kPa) and 20,000 psi (138,000 kPa) were employed. It was observed that at about 5,000 psi (34,500 kPa) several drops of liquid were forced out of the die, so that the crystals were being further dewatered in the press. In the test at 20,000 psi (138,000 kPa), both fluid and a paste were extruded from the die. In both tests, coherent, hard wafers were produced.

The results show that silver nitrate powder, in either wet or dry form, can be pressed into coherent compacts without necessitating the addition of a binder.

Operation of the present invention is believed to be apparent from the foregoing description and drawings, but a few words will be added for emphasis.

The process and apparatus of the invention provide an economical, expedient way to prepare silver nitrate. The compacted silver nitrate product of the invention has superior flowability characteristics and is less prone to fuse than non-compacted silver nitrate. The apparatus and process of the invention are particularly suited for processing a substantially cubic crystal form of silver nitrate, which is easier to deliquor or separate from a slurry.

While the invention has been described with particular reference to a preferred embodiment, it will be understood by those skilled in the art that various changes may be made and equivalents may be substituted for elements of the preferred embodiment without departing from invention. In addition, many modifications may be made to adapt a particular situation and material to a teaching of the invention without departing from the essential teachings of the present invention. For example, the invention is also considered to encompass a precompactor for initially compacting the silver nitrate crystal output of the separator and dryer prior to feeding the material to the compactor.

As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

What is claimed is:

1. A process for forming compacted silver nitrate bodies comprising:

introducing a feed solution of an aqueous silver nitrate solution to an evaporative crystallizer, the silver nitrate solution having a concentration of silver nitrate of approximately 60 to 90 percent by weight;

heating and concentrating by evaporation the aqueous silver nitrate solution in a crystallization zone of the evaporative crystallizer while maintaining a vacuum in the crystallizer to form a supersaturated slurry comprising silver nitrate crystals, wherein the temperature of the slurry is approximately 100°–149° .F and the vacuum is maintained from about 23 mm Hg to about 200 mm Hg absolute;

establishing a mean residence time of the slurry in the crystallization zone of approximately 60 to 180 minutes;

controlling the slurry density to approximately 2.7 gm/cc to 3.2 gm/cc;

agitating the slurry;

obtaining silver nitrate crystals having a size in the range of 200 μm to about 600 μm and having an aspect ratio of from about 1:2:3 to about 1:1:1;

withdrawing slurry from the crystallizer at a rate approximately equal to the rate of the introducing of the feed solution;

separating and drying from the withdrawn slurry silver nitrate crystals via a centrifuge;

feeding the separated dried crystals from the centrifuge to a compactor; and compacting the separated dried crystals to form a plurality of compacted silver nitrate pellets.

2. The process according to claim 1 further comprising:

cooling the plurality of compacted silver nitrate pellets to above room temperature.

3. The process according to claim 1 wherein the evaporative crystallizer is a draft tube crystallizer.

4. The process of claim 1 wherein the vacuum is maintained at about 112 mm Hg absolute.

* * * * *